United States Patent [19]

Munetsugu

[11] 4,231,024
[45] Oct. 28, 1980

[54] DEVICE FOR A DIGITAL ARITHMETIC PROCESSING APPARATUS

[75] Inventor: Eiichi Munetsugu, Kawasaki, Japan

[73] Assignee: Tokyo Shibaura Electric Co., Ltd., Japan

[21] Appl. No.: 741,504

[22] Filed: Nov. 12, 1976

[30] Foreign Application Priority Data

Nov. 14, 1975 [JP] Japan ................. 50-136188

[51] Int. Cl.² .................................... G06F 3/02
[52] U.S. Cl. ................. 340/365 S; 307/304; 307/313
[58] Field of Search ............. 340/365 R, 365 S, 365 E; 307/288, 313, 304, 11, 247 A; 178/17 A, 17 C; 179/90 K; 235/145 R; 364/707, 709, 710

[56] References Cited

U.S. PATENT DOCUMENTS

| | | | |
|---|---|---|---|
| 3,631,528 | 12/1971 | Green | 307/313 |
| 3,717,871 | 2/1973 | Hatano et al. | 340/365 S |
| 3,721,976 | 3/1973 | Kuijsten | 340/365 E |
| 4,051,471 | 9/1977 | Hatano et al. | 340/365 S |

*Primary Examiner*—John W. Caldwell, Sr.
*Assistant Examiner*—James J. Groody
*Attorney, Agent, or Firm*—Finnegan, Henderson, Farabow, Garrett & Dunner

[57] ABSTRACT

A data-entry device for digital arithmetic processing apparatus which has a semiconductor integrated circuit provided with a plurality of terminals, key signal control leads, the one side ends of which are connected to respective ones of the plurality of terminals, and a keyboard device having terminals connected to the other side ends of the key signal control leads. The semiconductor integrated circuit includes a plurality of FET's with respective drains connected to respective terminals of the semiconductor integrated circuit with sources grounded and with gates applied with key signal-generating pulses in different timings. The semiconductor integrated circuit further includes at least one timing inhibition circuit which has a first input terminal connected to at least one of the terminals of the semiconductor integrated circuit and has a second input terminal supplied with a key signal-generating pulse. There is also provided at least one inverter connected to one of the plurality of terminals of the semiconductor integrated circuit. The keyboard device is provided with a plurality of key switches connected between the respective keyboard terminals. The data entry device operates such that upon receipt of a key signal-generating pulse the inhibition circuit inhibits a key signal from the corresponding key switch.

7 Claims, 7 Drawing Figures

DEVICE FOR A DIGITAL ARITHMETIC PROCESSING APPARATUS

This invention relates to a data-entry device for a digital arithmetic processing apparatus, for example, a desk-top electronic calculator.

The desk-top electronic calculator comprises a data-entry device provided with a keyboard fitted with numeral keys representing digits of 0 to 9 and function keys denoting mathematical notations, for example, x, ÷, =; an arithmetic processing device formed in a semiconductor integrated circuit for carrying out logic operations in accordance with data supplied from the keyboard; and display means for visibly indicating the result of a logic operation. The display elements of said display means consist of fluorescent display tubes, light-emitting diodes or liquid crystal elements of low power consumption.

Where a fluorescent display tube or light-emitting diode is used, it is possible to adopt a dynamic display system by which the respective digits are displayed in specified timing or in a time-division fashion. Where, however, the liquid crystal display element is used; it is impossible to display the respective digits in specified timing, because the liquid crystal display element makes a slow response. Therefore, the customary practice is to display the respective digits by grouping some of them. Where, therefore, the liquid crystal display element is used, a semiconductor integrated circuit connected to a display device of, for example, nine digits with eight segments/digit, the display device has ten more terminal pins than when a fluorescent display tube or light-emitting diode is applied. When a comparison is made with the liquid crystal display element, the respective digits are assumed to be displayed in groups of three.

Circuits used with digital arithmetic processing devices integrated in a single semiconductor chip are now required to perform an increasing number of circuit functions. The more numerous the required circuit functions, the larger the number of pins provided in the semiconductor integrated circuit. This means, on the contrary, that a limitation is imposed on the number of circuit functions which a single chip can admit. Such a drawback becomes prominent, as seen from the foregoing description, where a liquid crystal element is used for display. Further, an increased number of pins used with a semiconductor integrated circuit immediately raises the cost of the integrated circuit. From this point of view, the number of said pins is preferred to be as small as possible.

It is accordingly the object of this invention to provide a data-entry device which enables a smaller number of pins to be used with a semiconductor integrated circuit connected to a keyboard device.

According to an aspect of this invention, there is provided a data-entry device which comprises a semiconductor integrated circuit having a plurality of terminal pins; a plurality of key signal control leads each conducted at one end to a corresponding terminal pin; and a keyboard device whose keyboard terminals are connected to the other ends of the key signal control leads and which is provided with a plurality of key switches disposed between the respective keyboard terminals, wherein at least one of the key signal control leads is concurrently used as a key signal-generating lead and also as a lead for writing a key signal.

This invention can be more fully understood from the following detailed description when taken in conjunction with the accompanying drawings, in which.

Figure 6:
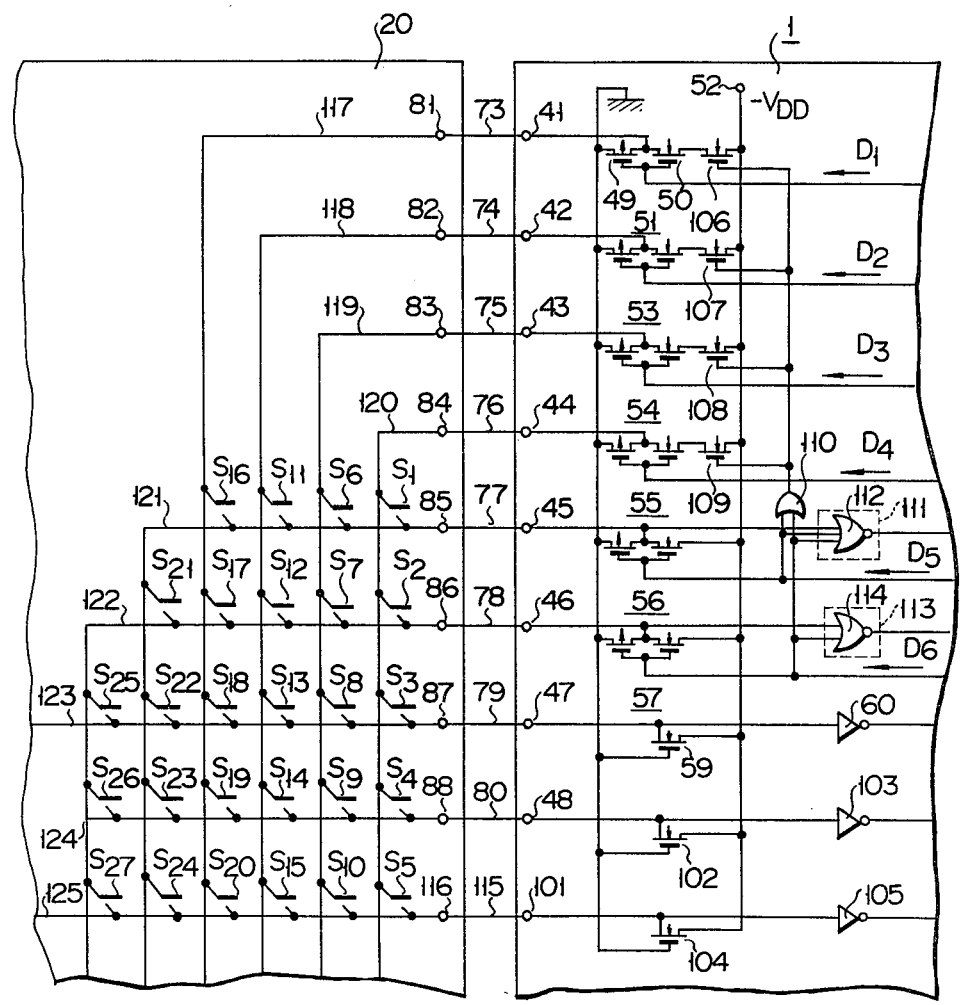
FIG. 6 is a circuit diagram of still another embodiment of the invention.
Figure 7:
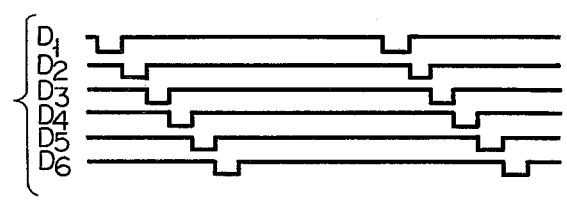

FIG. 7 indicates the waveforms of signals used with the circuit of FIG. 6.

Figure 1:
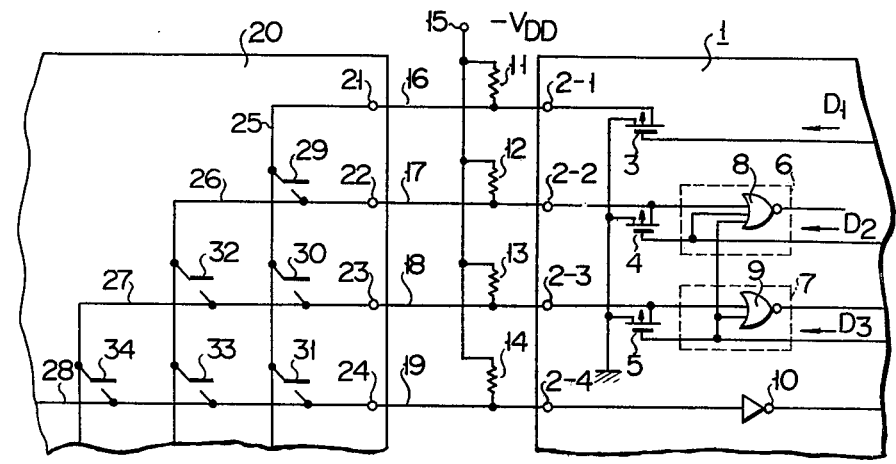
FIG. 1 is a circuit diagram of a data-entry device according to one embodiment of this invention.
Figure 2:
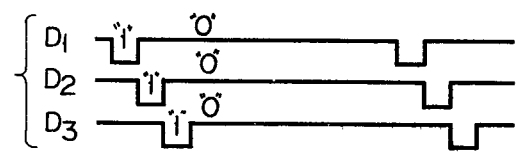
FIG. 2 shows the waveforms of signals used with the circuit of FIG. 1.

Referring to FIG. 1, a semiconductor integrated circuit represented by referential numeral 1 has four terminals 2-1, 2-2, 2-3, 2-4. The terminals 2-1, 2-2, 2-3 are connected to the drains of P-channel type MOS transistors 3, 4, 5, whose sources are grounded and whose gates are supplied with key signal generating pulses $D_1$, $D_2$, $D_3$ shown in FIG. 2. These pulses $D_1$, $D_2$, $D_3$ are produced in the semiconductor integrated circuit 1 in different timings as illustrated in FIG. 2.

The terminals 2-2, 2-3 are also connected to one of the input terminals of NOR circuits 8, 9 respectively included in timing-inhibition circuits 6, 7. The other two input terminals of the NOR circuit 8 are supplied with key signal-generating pulses $D_2$, $D_3$. The remaining input terminal of the other NOR circuit 9 is supplied with a key signal-generating pulse $D_3$. Outputs from the NOR circuits 8, 9 are delivered to, for example, an arithmetic processing device (not shown). The terminal 2-4 is connected to the input terminal of an inverter 10, an output from which is also sent forth to the arithmetic processing device. The semiconductor integrated circuit used with this invention is arranged as described above.

The terminals 2-1, 2-2, 2-3, and 2-4 of the semiconductor integrated circuit 1 are jointly connected to a power supply terminal 15 having a negative voltage-$V_{DD}$ through resistors 11, 12, 13, 14, and also to the terminals 21, 22, 23, 24 of a keyboard device 20 through key signal control leads 16, 17, 18, 19. The keyboard terminals 21 to 24 are respectively connected to one end of the lines 25, 26, 27, 28 arranged in matrix form. Six keyboard switches 29, 30, 31, 32, 33, 34 are provided at the intersections of said lines 25 to 28 for selective connection thereof.

A negative logic ($-V_{DD}$ is represented by a binary code "1" and the grounding level by a binary code "0") is used throughout the following description. Where, in FIG. 1, a keyboard switch 29 connected between lines 25, 26 is closed, then a key signal generating pulse $D_1$ has a level of "0". Where MOS transistor 3 becomes operative, then the negative voltage $-V_{DD}$ of the power supply terminal 15 is supplied to one of the input terminals of the NOR circuit 8 through the resistor 11, lead 16, terminal 21, lines 25, 26, terminal 22, lead 17 and terminal 2-2, respectively. Where, at this point, the key signal-generating pulse $D_1$ has a level of "1", then the transistor 3 is rendered conducting, causing the terminal 2-2 to be supplied with a signal of "0". Since all the three input terminals of the NOR circuit 8 are supplied with signals of "0", a key output of "1" corresponding to the pulse $D_1$ is sent forth from said NOR circuit 8. In this case, the lead 16 is used to generate a key signal and the lead 17 to write a key signal.

When a keyboard switch 30 connected between lines 25 and 27 is closed, then the NOR circuit 9 produces an output of "1" corresponding to a key signal generating pulse $D_1$ having a logic level of "1". At this time, the lead 16 is used to generate a key signal and the lead 18 to write a key signal.

When a keyboard switch 31 connected between lines 25 and 28 is closed, then a pulse $D_1$ having an inverted waveform is supplied from the transistor 3 to an inverter 10 through the lead 19 and terminal 2-4. In this case, the lead 16 is used to generate a key signal and the lead 19 to write a key signal.

When a keyboard switch 32 connected between lines 26 and 27 is closed, an inverted pulse $D_2$ is conducted to one of the input terminals of the NOR circuit 9 through the lead 17, lines 26, 27 and lead 18, respectively. Where, at this time, the gate of the MOS transistor 4 is supplied with a key signal-generating pulse $D_2$ of "1", then said transistor 4 is rendered conducting to supply a "0" signal to one of the input terminals of the NOR circuit 9. As apparent from FIG. 2, a key signal-generating pulse has a logic level of "0", causing the NOR circuit 9 to send forth a key signal of "1" corresponding to the pulse $D_2$. In this case, the lead 17 is used to generate a key signal and the lead 18 to write a key signal.

When a keyboard switch 33 connected between lines 26 and 28 is closed, then an inverted pulse $D_2$ is delivered to the inverter 10 through the lead 17, lines 26, 28 and lead 19. Where, at this time, the gate of the MOS transistor 4 is supplied with a key signal generating pulse $D_2$ to render said transistor 4 conducting, then a grounding voltage is supplied to the inverter 10, which in turn produces a key signal of "1" corresponding to the pulse $D_2$.

When a keyboard switch 34 connected between lines 27 and 28 is closed then the inverted pulse $D_3$ is sent forth to the inverter 10 through the lead 18, lines 27, 28 and lead 19, respectively. Where, at this time, the gate of the MOS transistor 5 is supplied with a key signal generating pulse $D_3$ of "1", then said transistor 5 is rendered conducting to supply grounding voltage, that is, a "0" signal to the input side of the inverter 10, which in turn generates an output corresponding to the key signal-generating pulse $D_3$.

With the circuit of FIG. 1 containing timing-inhibition circuits 6, 7, an output from the NOR circuit is not affected by pulses $D_2$, $D_3$. For example, even where the keyboard switch 32 is depressed, a signal corresponding to a pulse $D_3$ is not generated at the output terminal of said NOR circuit 8. The NOR circuit 9 also doesn't produce a signal corresponding to the pulse $D_3$.

The circuit arrangement of FIG. 1 enables the key signal control lead 16 to be used to generate a key signal through the keyboard switches 29, 30, 31 and also the key signal control lead 17 to be applied for generation of a key signal through the keyboard switches 32, 33 as well as for writing a key signal through the keyboard switch 29. The key signal control lead 18 is used to send forth a key signal through the keyboard switch 34 and also to write a key signal through the keyboard switches 30, 32. The key signal control lead 19 is applied in writing a key signal through the keyboard switches 31, 33, 34.

Figure 3:
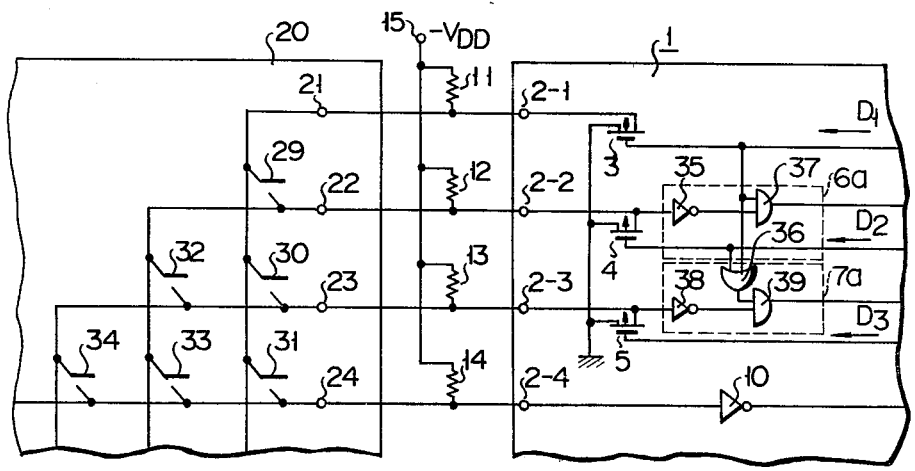
FIG. 3 is a circuit diagram of a modification of FIG. 1.

With the embodiment of FIG. 1, the timing-inhibition circuits 6, 7 containing NOR circuits 8, 9 enable key signals corresponding to key signal-generating pulses $D_1$, $D_2$ to be issued from the NOR circuits 8, 9. However, a timing-inhibition circuit having a different arrangement can be applied with the same result. FIG. 3 is a modification of FIG. 1 whose timing-inhibition circuit alone in different from that of FIG. 1, the parts of FIG. 3 the same as those of FIG. 1 being denoted by the same numerals. The timing-inhibition circuit 6a of FIG. 3 comprises an inverter 35 whose input terminal is connected to the terminal 2-2 and an AND circuit 37, one of whose input terminals is connected to the output terminal of the inverter 35, and the other of whose input terminals is connected to the gate of the MOS transistor 3 and one of the input terminals of an OR circuit 36 included in a timing-inhibition circuit 7a. The timing-inhibition circuit 7a comprises an inverter 38 whose input terminal is connected to the terminal 2-3, OR circuit 36 whose input terminals are connected to the gates of the MOS transistors 3, 4 respectively, and an AND circuit 39 whose input terminals are supplied with outputs from the OR circuit 36 and inverter 38.

Where, in FIG. 3, the keyboard switch 29 is closed and a key signal-generating pulse $D_1$ is supplied to the gate of the MOS transistor 3, then the inverter 35 generates an output of "1". Upon receipt of the pulse $D_1$ and a "1" output from said inverter 35, AND circuit 37 produces a key output corresponding to the pulse $D_1$.

Where the keyboard switch 30 is closed, and the key-signal-generating pulse $D_1$ is delivered to the gate of the MOS transistor 3, then the inverter 38 sends forth an output of "1". Upon receipt of the pulse $D_1$ through the circuit 36 and a "1" output from the inverter 38, the AND circuit 39 issues a key signal corresponding to the pulse $D_1$.

Where the keyboard switch 32 is closed and a key signal-generating pulse $D_2$ is transmitted to the gate of the MOS transistor 4, then the inverter 38 generates an output of "1". Upon receipt of the pulse $D_2$ through the OR circuit 36 and a "1" output from the inverter 38, the AND circuit 39 issues an output corresponding to the pulse $D_2$. The point is that a timing-inhibition circuit used should be so arranged as to enable a signal to be produced in a state corresponding only to the key signal generating pulses $D_1$, $D_2$, $D_3$ and free from the effect of other signals. In FIG. 3, the key signal control leads 17, 18 are also used not only to generate but also to write a key signal.

As seen from the foregoing description, the key signal control leads of the prior art data-entry device were restrictively used either to generate or write a key signal. The embodiment of FIG. 1 and its modification of FIG. 3, however, enable the key signal control leads 17, 18 to be applied not only in generating but also writing a key signal. Therefore, the arrangements of FIGS. 1 and 3 enable six key outputs to be produced through four key signal control leads, though the prior art data-entry device allowed the same four key signal control leads to issue only four key outputs. According to this invention, application of key signal control leads of an n number generally causes key outputs to be produced in a number of $\frac{1}{2}n(n-1)$, thereby decreasing a number of pins used with a semiconductor integrated circuit provided close to a keyboard.

Figure 4:
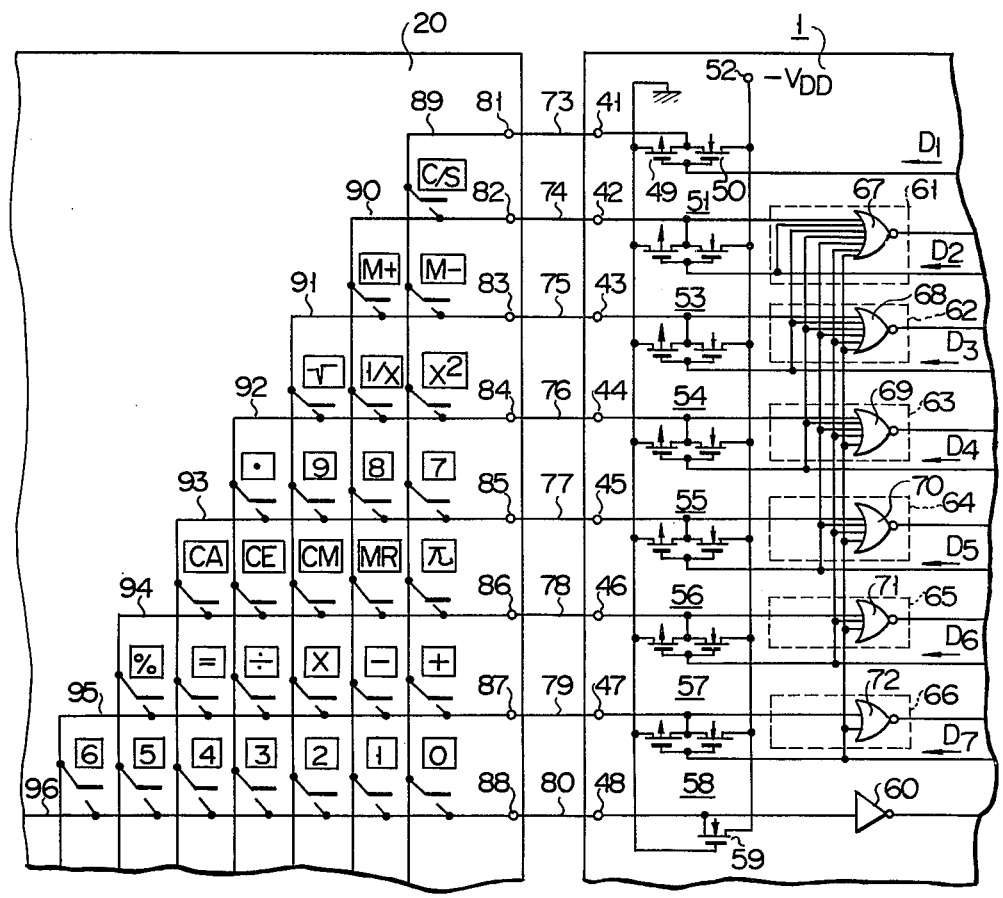
FIG. 4 is a circuit diagram of another embodiment of the invention.
Figure 5:
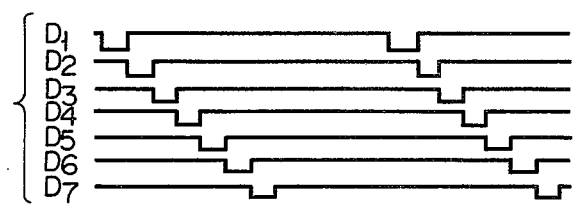
FIG. 5 shows the waveforms of signals used with the circuit of FIG. 4.

There will now be described by reference to FIGS. 4 and 5 the case where the data-entry device of this invention is used with an electronic desk-top calculator. In the embodiment of FIGS. 4 and 5, the semiconductor integrated circuit 1 is formed of a complementary MOS circuit. The semiconductor integrated circuit 1 of FIG.

4 is provided with eight terminals 41, 42, 43, 44, 45, 46, 47, 48. The terminal 41 is connected to the output terminal of a complementary MOS circuit 51 formed of complementary MOS type P-channel transistor 49 and N-channel transistor 50. The input terminal of said complementary MOS circuit 51 are supplied with a key signal generating pulse $D_1$ (FIG. 5). The source of the P-channel transistor 49 is grounded, and that of the N-channel transistor 50 is connected to a power supply terminal 52 having a negative voltage of $-V_{DD}$. The terminals 42 to 47 are connected to the output terminals of complementary MOS circuits 53, 54, 55, 56, 57, 58, respectively whose input terminals are supplied with key signal-generating pulses $D_2$, $D_3$, $D_4$, $D_5$, $D_6$, $D_7$ (FIG. 5) respectively. The terminal 48 is connected to the drain of an N-channel MOS transistor 59 and the input terminal of an inverter 60. The source of said transistor 59 is connected to the power supply terminal 52.

The terminals 42 to 47 are respectively connected to one of the input terminals of each of NOR circuits 67, 68, 69, 70, 71, 72 included in timing-inhibition circuits 61, 62, 63, 64, 65, 66. The remaining input terminals of the NOR circuit 67 are supplied with key signal-generating pulses $D_2$ to $D_7$; the remaining input terminals of the NOR circuit 68 with pulses $D_3$ to $D_7$; the remaining input terminals of the NOR circuit 69 with pulses $D_4$ to $D_7$; the remaining input terminals of the NOR circuit 70 with pulses $D_5$ to $D_7$; the remaining input terminals of the NOR circuit 71 with pulses $D_6$, $D_7$; and the other input terminal of the NOR circuit 72 with a pulse $D_7$.

The terminals 41 to 48 of the semiconductor integrated circuit 1 arranged as described above are connected to the terminals 81, 82, 83, 84, 85, 86, 87, 88 of the keyboard device 20 through key signal control leads 73, 74, 75, 76, 77, 78, 79, 80. The terminals 81 to 88 are connected to one side terminals of lines 89, 90, 91, 92, 93, 94, 95, 96 arranged in the matrix form. The intersections of lines 89 to 96 are provided with 28 keyboard switches. Among these 28 keyboard switches, those designated by digits 0 to 9 are numeral keys. Notations $+$, $-$, $\times$, $\div$, $=$, %, M+, M−, $\sqrt{\ }$, $(1/x)$, $x^2$, · are function keys. C/S denotes a change sign key; CA an all clear key; CE a clear entry key; CM a clear memory key; MR a memory recall key; and $\pi$ a circumference-diameter ratio key. For briefness of description, referential notations denoting key switches concurrently represent keys.

For example, where a keyboard switch "7" is depressed, then N-channel MOS transistor 50 is rendered conducting when a key signal generating pulse $D_1$ has a logic level of "0", then a key "7" generates an output pulse corresponding to said pulse $D_1$ on the output side of the NOR circuit 70. Since, at this time, transistors 49, 50 are not put into operation simultaneously by the key signal-generating pulse $D_1$, the complementary MOS circuit 51 comprising said transistors 49, 50 consumes less power than in the embodiment of FIG. 1 and the modification thereof of FIG. 3. The mutual conductance Gm of the complementary MOS N-channel transistors 50, 53 to 58 is chosen to be smaller than that of the P-channel transistor 49 in order to prevent excess current from running through a key signal control lead when a keyboard switch is depressed.

The complementary MOS circuits 51, 53 to 58 and the timing-inhibition circuits 61 to 66 of the embodiment of FIG. 4 carry out the same operation upon depression of a keyboard switch as those of the embodiment of FIG. 1, any further description thereof being omitted. In the case of FIG. 4, key signal control leads 74 to 79 are used not only to generate but also to write a key signal. Therefore the eight key signal control leads 73 to 80 can produce 28 key signals, because n in the formula of $\frac{1}{2}n(n-1)$ is taken to be 8.

There will now be described by reference to FIGS. 6 and 7 still another embodiment of this invention. The parts of FIG. 6 the same as those of FIG. 4 are denoted by the same numerals. A semiconductor integrated circuit 1 has nine terminals 41 to 48, 101. The terminals 41 to 46 are connected to the output terminals of complementary MOS circuits 51, 53 to 57. The terminal 47 is connected to the drain of a transistor 59 and inverter 60. The terminal 48 is connected to the drain of a transistor 102 and the input terminal of an inverter 103. The terminal 101 is connected to the drain of a transistor 104 and the input terminal of an inverter 105. The source of the transistor 50 included in the complementary MOS circuit 51 is connected to the power supply terminal 52 having a voltage of $-V_{DD}$ through an N-channel MOS transistor 106. The complementary MOS circuits 53 to 55 are connected to said power supply terminal 52 through N-channel MOS transistors 107, 108, 109.

Key signal-generating pulses $D_5$, $D_6$ supplied to the input terminals of the complementary MOS circuits 56, 57 are also conducted to the input terminal of an OR circuit 110 whose output terminal is connected in common to the gates of the transistors 106 to 109. Key signal-generating pulses $D_5$, $D_6$ and an output from the complementary MOS circuit 56 are delivered to the input terminal of a NOR circuit 112 included in a timing-inhibition circuit 111. The key signal-generating pulse $D_6$ is further sent forth to the complementary MOS circuit 57 and also to the input terminal of a NOR circuit 114 included in a timing-inhibition circuit 113.

The nine terminals 41 to 48, 101 of the semiconductor integrated circuit arranged as described above are connected to the terminals 81 to 88, 116 of the keyboard device 20 through key signal control leads 73 to 80, 115. The terminals 81 to 88, 116 are connected to one side terminals of lines 117, 118, 119, 120, 121, 122, 123, 124, 125 arranged in the matrix form. The intersections of lines 117 to 125 are provided with 27 switches $S_1$ to $S_{27}$. The input terminals of the complementary MOS circuits 51, 53 to 57 are supplied with key signal-generating pulses $D_1$ to $D_6$ in different timings as illustrated in FIG. 7.

With the embodiment of FIG. 6, key signal control leads 73 to 76 are used exclusively to generate a key signal. Key signal control leads 77, 78 are applied not only to generate but also to write a key signal. Key signal control leads 79, 80, 81 are exclusively intended for the writing of key signals. With the embodiment of FIG. 6, the pulses $D_5$ $D_6$ are carried to the gates of transistors 106 to 109 through the OR circuit 110. The transistors 106 to 109 are cut off in the timing of the pulse $D_5$ or $D_6$, thereby preventing excess current from running from the key signal control leads 77, 78 to the key signal control leads 73 to 76 even when a keyboard switch is depressed. The same effect can be attained by connecting a single transistor instead of the transistors 106 to 109, in common to the leads 73 to 76.

With the embodiment if FIG. 6, it will be sufficient of the mutual conductance Gm of the N-channel MOS transistor 50 constituting the complementary MOS circuits 51, 53, 54, 55 is chosen to be smaller than that of the P-channel MOS transistor 49 constituting the complementary MOS circuits 56, 57, even when the transistors 106 to 109 and OR circuit 110 are omitted. The mutual conductance of the N-channel MOS transistor constituting the complementary MOS circuits 56, 57 and that of the transistors 59, 102, 104 are chosen to be smaller than that of the P-channel MOS transistors included in the circuits 56, 57, as in the embodiment of FIG. 4.

With the embodiment of FIG. 6, the same circuit arrangement as in FIG. 1 or FIG. 4 is adapted only in part, making it possible to produce 27 key signals through 9 key signal control leads. If, however, all the control leads are connected in the same manner as in FIG. 1 or 4, then 36 keys can be distinguished from each other with n in the formula $\frac{1}{2}n(n-1)$ taken to be 9.

The respective circuits of the foregoing embodiments need not be restrictively formed of the arrangements described in connection therewith. For example, the timing-inhibition circuit of FIG. 3 may be adopted for the embodiment of FIG. 4 or 6. Further, it is possible to provide a circuit in which, a signal from the keyboard is supplied, after reversed, to a flip-flop circuit, and said keyboard signal is written in the timing of a desired signal, for example, a pulse $D_1$. The point is that a timing-inhibition circuit should be the type which saves a key signal from the effect of any other signal.

What is claimed is:

1. A data entry device comprising:
   a keyboard device having a first keyboard terminal, at least one second keyboard terminal, and a third keyboard terminal;
   a plurality of keyboard switch means for selectively interconnecting said first, second, and third keyboard terminals;
   a semiconductor integrated circuit for cyclically providing at least first and second keyboard sampling pulses at different times with respect to each other;
   a first terminal pin;
   at least one second terminal pin;
   a third terminal pin;
   a first gate circuit through which said first terminal pin receives said first keyboard sampling pulses;
   a second gate circuit through which said at least one second terminal pin receives said second keyboard sampling pulses;
   an output-only lead connecting said first terminal pin and said first keyboard terminal for transmitting said first keyboard sampling pulses from said first terminal pin to said first keyboard terminal;
   an output/input lead connecting said at least one second terminal pin with said at least one second keyboard terminal, said output/input lead (1) for transmitting a said first keyboard sampling pulse from said at least one second keyboard terminal to said at least one second terminal pin when a said keyboard switch means is selected to interconnect said first keyboard terminal to said at least one second keyboard terminal during the occurrence of a said first keyboard sampling pulse, and (2) for transmitting said second keyboard sampling pulses from said at least one second terminal pin to said at least one second keyboard terminal;
   at least one timing-inhibition circuit having an input terminal connected to a said at least one second terminal pin for generating a key select signal only in response to said transmission of a said first keyboard sampling pulse to said at least one second terminal pin; and
   an input-only lead connecting said third keyboard terminal to said third terminal pin for transmitting said first keyboard sampling pulses to said third terminal pin when a said keyboard switch means is selected to interconnect said first keyboard terminal to said third keyboard terminal, and for transmitting said second keyboard sampling pulses to said third terminal pin when a said keyboard switch means is selected to interconnect a said at least one second keyboard terminal to said third keyboard terminal.

2. A data-entry device according to claim 1, wherein the timing-inhibition circuit comprises an inverter having an input terminal, connected to said at least one second terminal pin, and an output terminal, and an AND circuit having a first input connected to the output terminal of said inverter and a second input supplied with either said first keyboard sampling pulses or said second keyboard sampling pulses.

3. A data-entry device according to claim 1, wherein the timing-inhibition circuit comprises an inverter having an input terminal connected to a said at least one second terminal pin and an output terminal; an AND circuit having a first input terminal connected to the output terminal of said inverter and a second input terminal; and an OR circuit having an output terminal connected to said second input terminal of said AND circuit and a first input terminal for receiving said first keyboard sampling pulses and a second input terminal for receiving said second keyboard sampling pulses.

4. A data entry device according to claim 1, wherein the second gate circuit comprises a complementary MOS circuit including at least one MOS transistor having a drain connected to said at least one second terminal pin, a grounded source, and a gate supplied with said second keyboard sampling pulses, whereby said MOS transistor receives said second keyboard sampling pulses and prevents a key select signal from being generated by said timing-inhibition circuit upon receipt of said second keyboard sampling pulses through said at least one second terminal pin.

5. A data entry device according to claim 1, wherein the timing inhibition circuit comprises a NOR circuit.

6. A data entry device according to claim 1, wherein the second gate circuit comprises at least one complementary MOS circuit having an output terminal connected to said at least one second terminal pin and an input terminal for receiving said second keyboard sampling pulses, said complementary MOS circuit including a P-channel MOS transistor and an N-channel MOS transistor connected in series between power supply terminals, whereby said complementary MOS circuit receives said second keyboard sampling pulses and prevents a key select signal from being generated by said timing-inhibition circuit upon receipt of said second keyboard sampling pulses from said at least one second terminal pin.

7. A data-entry device according to claim 6, wherein the N-channel MOS transistor and P-channel MOS transistor each have a mutual conductance and wherein the mutual conductance of the N-channel MOS transistor is smaller than the mutual conductance of the P-channel MOS transistor.

* * * * *